US008885247B2

(12) United States Patent
Letartre et al.

(10) Patent No.: US 8,885,247 B2
(45) Date of Patent: Nov. 11, 2014

(54) DEVICE FOR CONTROLLING OPTICAL FREQUENCY, METHOD OF MANUFACTURING SUCH A DEVICE

(75) Inventors: Xavier Letartre, Champagne au Mont d'Or (FR); Pierre Viktorovitch, Tassin la Deml Lune (FR); Jean-Louis Leclercq, Morance (FR); Christian Seassal, Lyons (FR)

(73) Assignee: Centre National de la Recherche Scientific—CNRS, Paris (FR)

( * ) Notice: Subject to any disclaimer, the term of this patent is extended or adjusted under 35 U.S.C. 154(b) by 177 days.

(21) Appl. No.: 13/387,607

(22) PCT Filed: Jul. 26, 2010

(86) PCT No.: PCT/FR2010/051578
§ 371 (c)(1),
(2), (4) Date: Mar. 14, 2012

(87) PCT Pub. No.: WO2011/020961
PCT Pub. Date: Feb. 24, 2011

(65) Prior Publication Data
US 2012/0170109 A1 Jul. 5, 2012

(30) Foreign Application Priority Data

Jul. 30, 2009 (FR) .................................. 09 03758

(51) Int. Cl.
*G02F 1/35* (2006.01)
*G02B 1/00* (2006.01)
(Continued)

(52) U.S. Cl.
CPC ............. *G02F 1/3534* (2013.01); *H01S 5/105* (2013.01); *G02F 2203/15* (2013.01); *G02B*
(Continued)

(58) Field of Classification Search
USPC .................. 385/122, 129–132; 359/326–332; 372/92, 98, 99, 102, 105
See application file for complete search history.

(56) References Cited

U.S. PATENT DOCUMENTS 6,466,709 B1 * 10/2002 Scherer et al. .................. 385/15
6,711,200 B1 * 3/2004 Scherer et al. .................. 372/64
(Continued)

FOREIGN PATENT DOCUMENTS

| GB | 2 366 666 A | 3/2002 |
| JP | 10 284806 A | 10/1998 |

OTHER PUBLICATIONS

Letartre X et al: "Switching devices with spatial and spectral resolution combining photonic crystal and MOEMS structures", Journal of Lightwave Technology, IEEE Service Center, New York, NY, vol. 21, No. 7, Jul. 1, 2003 pp. 691-1699.

(Continued)

*Primary Examiner* — Daniel Petkovsek
(74) *Attorney, Agent, or Firm* — Arent Fox LLP

(57) ABSTRACT

The present invention relates to a device for controlling optical frequency (F1, F2) about a central working frequency (F0). This device comprises a vertical cavity (2) formed of two parallel and partially reflecting walls (3a, 3b), and a membrane (6) comprising at least one layer (7a, 7b) structured in the form of a photonic crystal. In this device, the two walls (3a, 3b) are separated by an optical distance substantially proportional to half the wavelength (λ0) corresponding to the central working frequency (F0). The membrane (6) is integrated between the walls (3a, 3b) of the cavity (2) and devised in such a way as to exhibit a mode of optical resonance at this central working wavelength (λ0). At least one layer of the device is made up of at least one portion of a material exhibiting nonlinear optical properties. The present invention also relates to various systems implementing means of optical pumping and such a device for controlling optical frequency, as well as to a method of manufacturing such a device for controlling optical frequency.

23 Claims, 3 Drawing Sheets

(51) Int. Cl.
*G02F 1/017* (2006.01)
*G02F 2/00* (2006.01)
*B82Y 20/00* (2011.01)
*H01S 5/10* (2006.01)
*H01S 5/183* (2006.01)

(52) U.S. Cl.
CPC ... 1/005 (2013.01); *G02F 2201/346* (2013.01); *H01S 5/183* (2013.01); *G02F 1/01716* (2013.01); *G02F 2/004* (2013.01); *B82Y 20/00* (2013.01)
USPC .............. 359/326; 385/122; 372/98; 372/99; 372/105

(56) References Cited

U.S. PATENT DOCUMENTS

| | | | |
|---|---|---|---|
| 7,292,613 B2 * | 11/2007 | Vuckovic et al. | 372/43.01 |
| 7,778,296 B1 * | 8/2010 | Vuckovic et al. | 372/41 |
| 7,915,604 B2 * | 3/2011 | Shields | 257/9 |
| 2006/0245464 A1 * | 11/2006 | Hori et al. | 372/99 |

OTHER PUBLICATIONS

McCuthcheon M W et al.: "Second-order nonlinear mixing of two modes in a planar photonic crystal microcavity", Proceedings of the SPIE, vol. 6128, 612812, Feb. 9, 2006.

\* cited by examiner

DEVICE FOR CONTROLLING OPTICAL FREQUENCY, METHOD OF MANUFACTURING SUCH A DEVICE

CROSS-REFERENCE TO RELATED APPLICATION

This Application is a National Stage entry of International Application No. PCT/FR2010/051578, having an international filing date of Jul. 26, 2010; which claims priority to French Application No.: 0903758, filed Jul. 30, 2009, the disclosure of each of which is hereby incorporated in its entirety by reference.

TECHNICAL FIELD OF THE INVENTION

The present invention relates to the field of optical frequency control, particularly for the conversion of optical frequency into terahertz, as well as for their tuning. This control occurs by trapping the photons in a small volume —whereof the dimensions have for order of magnitude the wavelength— during a monitored period and by controlling the spatial distribution of the optical modes as well as their interaction with the outside world.

The invention more particularly relates to a device for controlling optical frequency around a central working frequency, comprising a vertical cavity formed of two parallel and partially reflecting walls, and a membrane comprising at least one layer structured in the form of a photonic crystal.

It also relates to a method for manufacturing such a device.

PRIOR ART

The prior art in this field comprises resonators achieved according to a so-called 2.5 dimensional approach, as disclosed in the patent document CN 1 897 375 A. This document describes a microlaser comprising a photonic crystal membrane within a Fabry-Pérot cavity.

In the aforementioned patent document CN 1 897 375 A, the positioning of Bragg mirrors on either side of the photonic crystal membrane makes it possible to reduce the optical losses (by increasing the quality factor) and improve laser directivity.

However, in this document, the device operates in monomode (one single optical frequency), without optical frequency tuning.

The Fabry-Pérot cavity makes the light interfere in order to select certain optical modes called resonant modes, the only ones able to remain in the cavity. From incident photons whereof the wavelength $\lambda 0$ corresponds to that of such a resonant mode, the photons radiated in the cavity are vertically confined by it in order to form these modes.

The photonic crystal has, at the wavelength $\lambda 0$, an optical mode which has a null group velocity (propagation velocity of the photons) in the plane of the membrane, thus ensuring that the photons guided in the membrane are laterally confined (slow Bloch mode). Moreover, its diffractive properties make it possible for it to be coupled to radiated modes in the direction normal to the membrane plane.

Hence, the optical modes associated respectively to the cavity and the photonic crystal, being spatially superposed and spectrally resonant, may enter into a strong coupling regime. Thus, two eigen modes, called "hybrid", of frequencies F1 and F2 around frequency F0 corresponding to the central working wavelength $\lambda 0$ are generated. These two eigen modes have both a guided character and a radiated character. The separation F2−F1 is directly proportional to the force of the coupling between the optical modes associated to the cavity and to the photonic crystal. The life time of photons in these modes is substantially controlled by the reflectivity of the mirrors forming the Fabry-Pérot cavity.

Prior to this 2.5 dimensional microresonator approach which makes a tridimensional confinement of photons possible, a Fabry-Pérot cavity and a photonic crystal, considered separately from each other, only provided solutions respectively at one and two dimensions.

These 2.5 dimensional resonators constitute compact components (owing to the operated spatial confinement), sensitive in wavelength and low in consumption. They make it possible, due to the high spatial confinement of photons and their long life time, to obtain, from a low incident power, a high density of electromagnetic energy for each of the generated resonant modes.

Nevertheless, the drawback of such a device resides in the impossibility of continually controlling the two frequencies F1 and F2 of the generated optical resonant modes.

SUMMARY OF THE INVENTION

One purpose of the present invention is to control the interactions between the two generated eigen modes of optical resonance and to continually control their eigen frequencies F1 and F2.

This problem is resolved according to the invention by a device for controlling optical frequency around a central working frequency, such as previously described, wherein the two walls are separated by an optical distance substantially proportional to half the wavelength corresponding to the central working frequency, the membrane is integrated between the walls of the cavity and arranged in such a way as to exhibit a mode of optical resonance at this central working wavelength, and at least one layer of the device is made up of at least one portion of a material exhibiting nonlinear optical properties.

The addition according to the invention of this material with nonlinear optical properties makes it possible to create a very high nonlinear interaction between the two eigen optical frequencies F1 and F2 of the cavity existing from the association of the cavity with the photonic crystal, this interaction being all the more reinforced as each frequency is associated to a resonant eigen mode. It is thus made possible to parameter the direct coupling between the resonant modes associated to the association of the cavity and the photonic crystal, such as either to create photons making it possible to accomplish modes F1 and F2, or to absorb photons at frequency F2 in order to emit photons at frequency F1 (if F2 is higher than F1), or to emit photons at frequency F1−F2 or F1+F2 based on photons with frequencies F1 and F2.

The wavelength of the slow Bloch mode of the photonic crystal is controlled by the opto-geometrical properties of the latter, namely the indexes of materials and their distribution in the plane of the membrane as well as the thickness of the membrane.

Preferably, the material exhibiting nonlinear optical properties is arranged at a maximum of the vertical distribution of the electromagnetic intensity of at least one of the resonant modes generated by the device, thus reinforcing all the more the nonlinear interaction between the two optical frequencies F1 and F2 corresponding to the two eigen modes generated by the cavity and the photonic crystal.

Preferably, the walls of the cavity are plane and exhibit high reflection coefficients, thus, making it possible to reinforce the optical interactions inside the cavity. Coefficients that are higher than or equal to 95% are preferred.

According to a particularly effective embodiment of these walls in terms of reflection coefficient, these are made up of Bragg mirrors.

To dispose of a device for controlling optical frequency that is compact, the cavity exhibits dimensions of the order of the working wavelength which may be micrometric if one works in the infrared. Due to the low volume of the cavity, a high spatial confinement of the optical modes is realized.

In order to efficiently confine the photons, the cavity exhibits a higher quality factor than that of the photonic crystal of the membrane. In fact, the quality factor of the cavity makes it possible to keep the photons for longer in the structure, thus, also reinforcing the matter-light interaction, and thus, the nonlinear interactions. As for the quality factor of the photonic crystal, it manages the coupling between the cavity mode and the photonic crystal mode: the lower this quality factor, the higher the coupling and the greater the difference F2−F1.

According to particular embodiments of photonic crystal:
the structuring of at least one layer of the photonic crystal of the membrane is exhibited in the form of a meshed structure over one dimension,
the structuring of at least one layer of the photonic crystal of the membrane is exhibited in the form of a meshed structure over two dimensions.

According to a particular alternative embodiment of the material exhibiting nonlinear optical properties, the latter is formed by one amongst a quantum well and a distribution of semiconductor quantum dots.

According to another embodiment of the invention for the optical frequency tuning, the device comprises means for vertically moving the membrane. These vertical moving means make it possible to control the membrane position within the cavity, thus, influencing the spatial overlapping of the two coupled optical modes and hence makes it possible to modulate the coupling force and thereby, the spectral separation F2−F1.

Still according to another embodiment of the invention for the optical frequency tuning, the device comprises means for relatively vertically moving a wall of the cavity with respect to the other. These vertical movement means make it possible to control the thickness of the cavity, thus influencing the central working wavelength $\lambda 0$ and, consequently, the frequency values F1 and F2 of the two generated eigen modes.

Henceforth, with the combination of these two movement means, it is thus made possible to tune in wavelength, both the wavelengths of the two resonant modes of the structure made of the cavity and the membrane as well as their spectral gap.

Preferably, at least one of the above movement means is of electro-mechanical nature. This type of movement means indeed offers a significant accessible tuning rate, at least of the order of the tenth of the central working wavelength.

The skilled person will note here that directing the light towards this device may also be operated according to a "dark field" configuration type (the angle of incidence of the incident beam is less than the critical angle of total reflection) or according to an "evanescent waves" configuration (the angle of incidence of the incident beam is higher than the critical angle of total reflection). Thus, it results that the device may be used both, or even in a concomitant manner, for applications of "free space optics" type and "guided optics" type.

The invention also relates to a system for converting optical frequency, comprising a device for controlling optical frequency according to any one of the above embodiments, as well as means for optically pumping one of the two generated eigen modes.

According to a first implementation embodiment of this system, the medium comprised between the two walls of the cavity is an active medium in saturable absorbent regime. Henceforth, in the case where the optical pumping means achieve the pumping for example only of the mode at the frequency F2, the device makes it possible to transfer a signal carried by an incident optical carrier of frequency F1 (frequency of one of the two modes) towards another carrier of frequency F2 (frequency of the other mode).

In this last case, in order for the signal transfer to be carried out at the rhythm of the digital modulation of the incident wave, the medium and the optical pumping means are determined such that one single eigen mode does not saturate the absorbent whereas the superposition of the two eigen modes saturates it.

According to a second embodiment for implementing this system, the medium comprised between the two walls of the cavity is a medium having an optical gain. Hence, when solely the frequency F2 is pumped, and when the laser threshold is attained, the device converts the received power at frequency F2 into a coherent signal at frequency F1. The presence of the optical resonance, not only for the laser mode but also for the pump signal, makes it possible to reduce the laser threshold, and thus the consumed power significantly.

The invention also relates to a system for adding and subtracting optical frequencies comprising a device for controlling optical frequency according to any one of the embodiments described above, as well as means for optically pumping the two generated eigen modes, the material of at least one layer of the device having nonlinear properties of the order of 2. Thus, the device being pumped at frequencies F1 and F2, and given the nonlinear effect of the order of 2, signals of frequency F1+F2 and F2−F1 may be generated. The high confinement in a same place of the two optical modes makes it possible to reinforce the conversion efficiency.

Finally, the invention relates to a method for manufacturing a device for controlling optical frequency around a central working frequency (F0), successively comprising:
the addition of a partially reflecting layer and a medium on a substrate,
the addition of the first portion of a heterostructure constituting a membrane formed by an assembly of layers whereof at least one is constituted in at least one portion of a material having nonlinear optical properties,
the structuring of at least one layer of said first portion in the form of a photonic crystal,
the addition of the second portion of said heterostructure such that it exhibits an optical resonant mode at the wavelength corresponding to the central working frequency, and
the addition of a medium and a partially reflecting layer on said second portion such that the partially reflecting layers be separated by a distance proportional to half said wavelength.

Thus, a device for controlling optical frequency around a central working frequency, exhibiting the advantages of the device object of the present invention, is achieved. Amongst others, the device obtained by this manufacturing method has the advantage of being compact, to very highly couple and in a nonlinear manner the two optical eigen frequencies generated, as well as to allow for a parameterization of this coupling, ensuring a continuous control of the two frequencies.

According to a particular embodiment, the addition of a portion of the heterostructure consists in a first step of depositing an assembly formed by said portion of the heterostructure and a substrate and a second step of removing the substrate from the assembly.

In order to achieve applications of optical frequency tuning, the method comprises a subsequent step for constituting means of moving one amongst the CP membrane and at least one partially reflecting layer.

BRIEF DESCRIPTION OF THE DRAWINGS

Other characteristics and advantages of the invention will become apparent upon reading the description which follows, with reference to the accompanying drawings, which illustrate.

For further clarity, the identical or similar members are identified by identical reference signs on the entirety of figs.

DETAILED DESCRIPTION OF AN EMBODIMENT

It will be understood in the present patent that an optical resonant mode corresponds to a state in which there are photons at a given wavelength in a given structure. These modes may be accomplished with photons, either by injecting light, or by using an emitting material within the structure.

Figure 1:
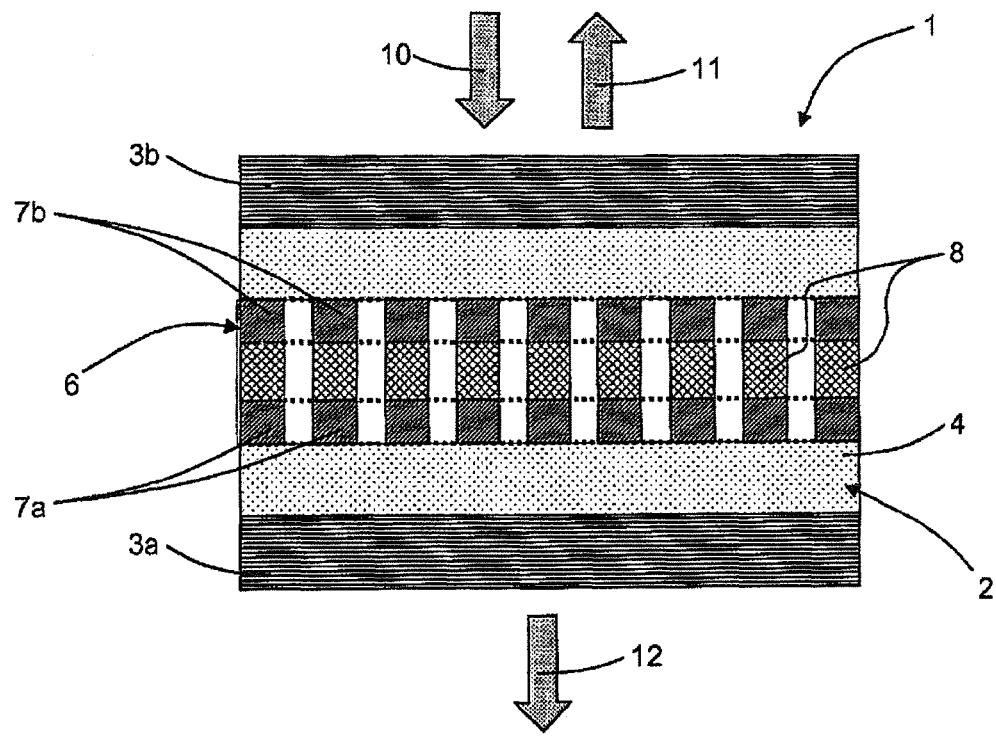
FIG. 1, a diagram representing a cross-sectional view of the device for controlling optical frequency according to a first embodiment of the invention, FIG. 2, diagrams representing a structured layer of the membrane, FIG. 3, a diagram representing a cross-sectional view of the device for controlling optical frequency according to a second embodiment of the invention comprising optical pumping means, FIG. 4, a diagram representing a cross-sectional view of the device for controlling optical frequency according to a third embodiment of the invention comprising means for moving certain members, and FIG. 5, a diagram representing the successive steps of the method for manufacturing a device for controlling optical frequency, according to a particular embodiment of the invention.

With reference to FIG. 1, a device 1 for controlling optical frequency according to a first embodiment of the invention comprises two coupled resonant members: a vertical cavity 2 and a photonic crystal membrane 6. This device associates these two members 2 and 6, which are liable to act individually as optical resonators. It operates around a central working frequency F0, to which corresponds a working wavelength λ0, by generating two eigen optical frequencies whereof the values are located symmetrically on either side of the central optical frequency F0.

The vertical cavity 2 is a Fabry-Pérot type cavity. It comprises two Bragg mirrors 3a and 3b. These mirrors are parallel and constitute partially reflecting walls whereof the reflection coefficients are higher than 95%. They are constituted in one succession of high index layers (silicon—Si) and low index layers (silicon dioxide—SiO2). Between these two walls, the cavity 2 comprises a medium 4, constituted for example in silicon dioxide (SiO2).

The optical thickness of this cavity, i.e., the distance between the two mirrors 3a and 3b, is equal to half the central working wavelength λ0 multiplied by a natural integer. Illuminated by an incident light 10, from which are generated a reflected light 11 and a transmitted light 12, the cavity 2 is thus able to radiate photons, prior confined within it, according to different optical resonant modes. The quality factor of this cavity 2 is high, of the order of 10.000.

The membrane 6 comprises an assembly of layers 7a, 7b and 8 constituting a photonic crystal, constituted for example of silicon (Si) in the case of a "passive" device or a III-V semiconductor-based heterostructure (for example GaAs or InP) integrating quantum wells (for example InGaAs) or planes of quantum dots (for example InAs). The photonic crystal is structured such as to exhibit an optical resonance at the same wavelength λ0 as that for which the cavity 2 resonates. The optical resonant mode from the crystal is a slow mode, called "Bloch mode", of the crystal.

Figure 2:
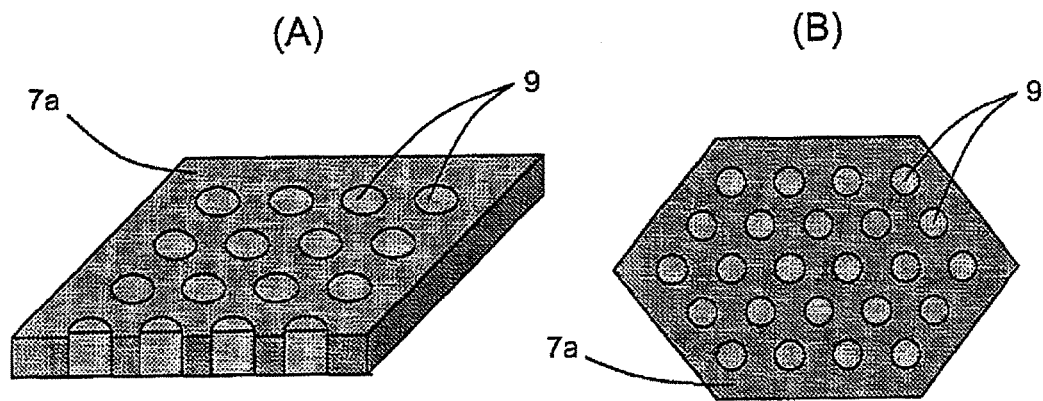

As represented in FIG. 2, the layers forming the photonic crystal of the membrane are structured in their thicknesses. In this instance, the layer 7a is structured according to a two-dimensional periodic meshed structure, comprising an assembly of structuring members 9. In accordance with FIG. 1, all the layers of the membrane 6, namely the layers 7a, 7b and 8, are structured in an identical manner with respect to each other and identically to the meshed structure in FIG. 2. In order to attain resonance at the central working wavelength λ0, the structuring of the membrane 6 is parameterized by the shape, the dimension and the relative position of the different structuring members 9 which constitute it. The quality factor of the photonic crystal is also adjusted by its geometry.

Thus, the photonic crystal of the membrane 6 constituted by this meshed structure ensures a lateral confining of the photons guided into the membrane.

This membrane 6 is integrated within the cavity 2, i.e., between the two mirrors 3a and 3b, parallel to the latter. The photonic crystal thus allows for, in addition to the lateral confinement, a diffractive coupling with the photons radiated and confined vertically by the cavity 2. Preferably, this membrane 6 is arranged with respect to the cavity 2 such as to attain the maximum of the optical mode field of this cavity.

Due to their association and their respective configuration, the cavity 2 and the membrane 6 have optical resonant modes which are spatially superposed and which resonate spectrally. The strong coupling regime between their optical modes helps to generate two eigen modes, called "hybrid modes", of optical frequencies F1 and F2, whereof the values are located symmetrically and on either side of the value of the central working frequency F0. These modes both have a guided character and a radiated character.

Here, the skilled person will note that the difference between the values F1 and F2 is directly proportional to the coupling force. Thus, it is possible to control these two values by an adequate parameterization of the coupling between the respective optical resonant modes of the cavity 2 and the membrane 6.

Amongst the assembly of layers 7a, 7b and 8 constituting the photonic crystal of the membrane 6, any one may be constituted of a material exhibiting nonlinear optical properties, thus, not excluding that several of them are.

The layer comprising this material with nonlinear optical properties is integrated within the membrane 6. It is obvious that the skilled person may arrange this layer differently inside the membrane. Particularly, it may form the assembly of layers of the membrane of the material with nonlinear optical properties or only form a portion of one single layer. According to different alternatives, this material with nonlinear optical properties is in the form of a well or a distribution of semiconductor quantum dots.

The addition of this nonlinear material makes it possible to create a very high nonlinear interaction between the two optical frequencies F1 and F2. This advantage is obtained thanks to the spatial and spectral confinement of the optical modes (high quality factor, low volume) and the high spatial overlapping of the two modes.

Figure 3:
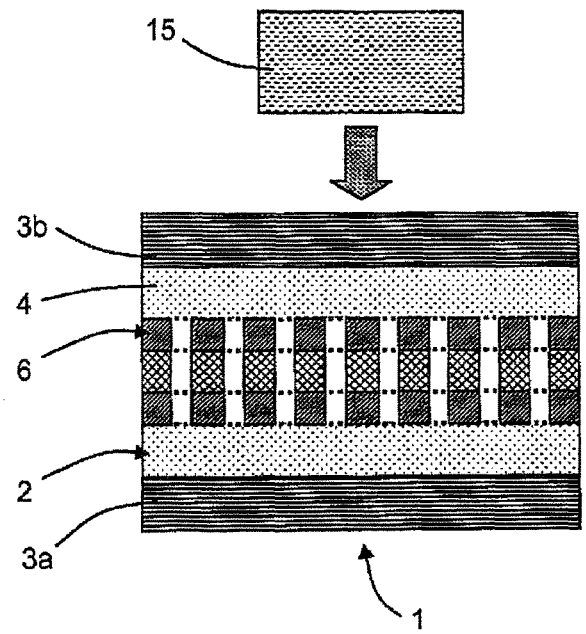

The first examples for implementing the aforementioned device for the realization of a system for converting, adding or subtracting frequencies, are illustrated by FIG. 3. In these examples, each system comprises a device 1 according to the invention and optical pumping means 15.

According to a first example, the medium 4 arranged between the two walls 3a and 3b of the cavity 2 is an active medium in saturable absorbent regime, located more precisely in the membrane 6. The dual mode structure forming the photonic crystal thus makes it possible to transfer the signal carried by an incident optical carrier of frequency F1 (frequency of one of the two eigen modes generated by the device 1) towards another carrier frequency F2 (frequency of the other eigen mode). For this, the optical pumping means 15 are arranged such as to only carry out the pumping of the eigen mode corresponding to the optical frequency F2. An optical information transported to frequency F1 reaches the device ("information" signal). At the same time, the latter receives the periodic signal transported at frequency F2, whereof the modulation frequency is identical to that of the information carried by F1 ("pump" signal). The active medium is capable of absorbing at both frequencies F1 and F2. The power carried by the pump does not make it possible to ensure the absorption saturation, whereas the conjugated powers of the information and the pump saturate the absorption. Thus, the information is transferred from carrier F1 to carrier F2.

According to a second embodiment, the medium 4 comprised between the two walls 3a and 3b of the cavity 2 is a laser effect medium. The device 1 receives optical information transported respectively at frequencies F1 and F2, whereof the modulation frequencies are identical. The active medium is capable of absorbing at the two frequencies F1 and F2. The optical pumping means 15 are arranged such that only the power at frequency F2 makes it possible to ensure the absorption saturation. When the laser threshold is reached, the structure converts the received power at frequency F2 into a coherent signal at frequency F1.

According to a third embodiment, the nonlinear optical properties of the material constituting the layer of photonic crystal of the membrane 6 are of the order of 2. The device 1 receives optical information transported respectively at frequencies F1 and F2, whereof the modulation frequencies are identical. The active medium is capable of absorbing at the two frequencies F1 and F2. The optical pumping means 15 are arranged such that the power at frequency F1 or the power at frequency F2 interchangeably makes it possible to ensure the absorption saturation. Hence, signals of frequency F1+F2 and F2−F1 may be generated. The high confinement of two eigen optical resonant modes in a same place at frequencies F1 and F2 makes it possible to reinforce the efficiency of the optical frequency conversion.

Figure 4:
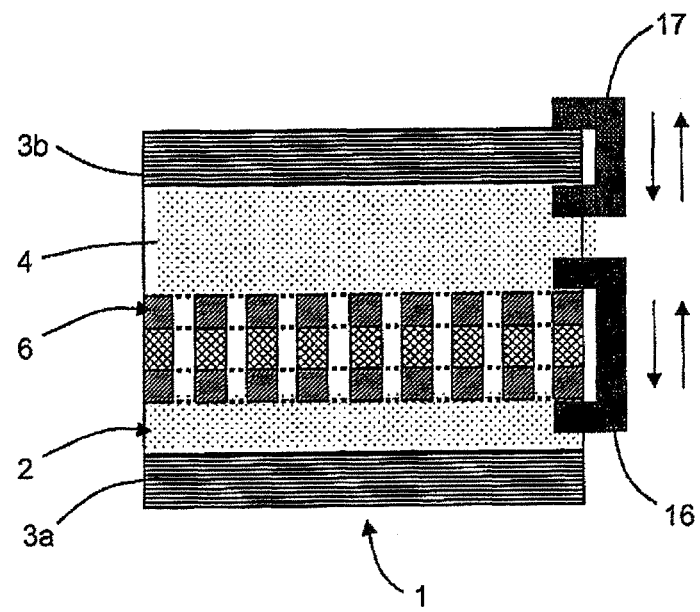

Examples of embodiments of the invention for wavelength tuning are illustrated by FIG. 4. To this end, the device comprises means 16 for vertically moving the membrane 6 and means 17 for relatively vertically moving the wall 3a of the cavity 2 with respect to the wall 3b. These means 16 and 17 may be electro-mechanical.

The means 16 make it possible to control the relative position of the membrane with respect to the walls 3a and 3b of the cavity. This movement makes it possible to modify the spatial overlapping of the two coupled modes of optical resonance, at frequencies F1 and F2, and thus to modulate their coupling force. It results a modification of the spectral gap between these two optical frequencies.

The means 17 make it possible to control the optical thickness of the cavity 2. The control of this thickness makes it possible to modify the value of the central working frequency F0 from which are generated the optical modes at frequencies F1 and F2. It results a common shifting of the values of these two optical frequencies.

Thus, the wavelength tuning of the device is carried out according to the position of the membrane 6 within the cavity 2 as well as the optical thickness of this cavity. One may thus tune both the values of these two eigen frequencies and their spectral gap.

Figure 5:
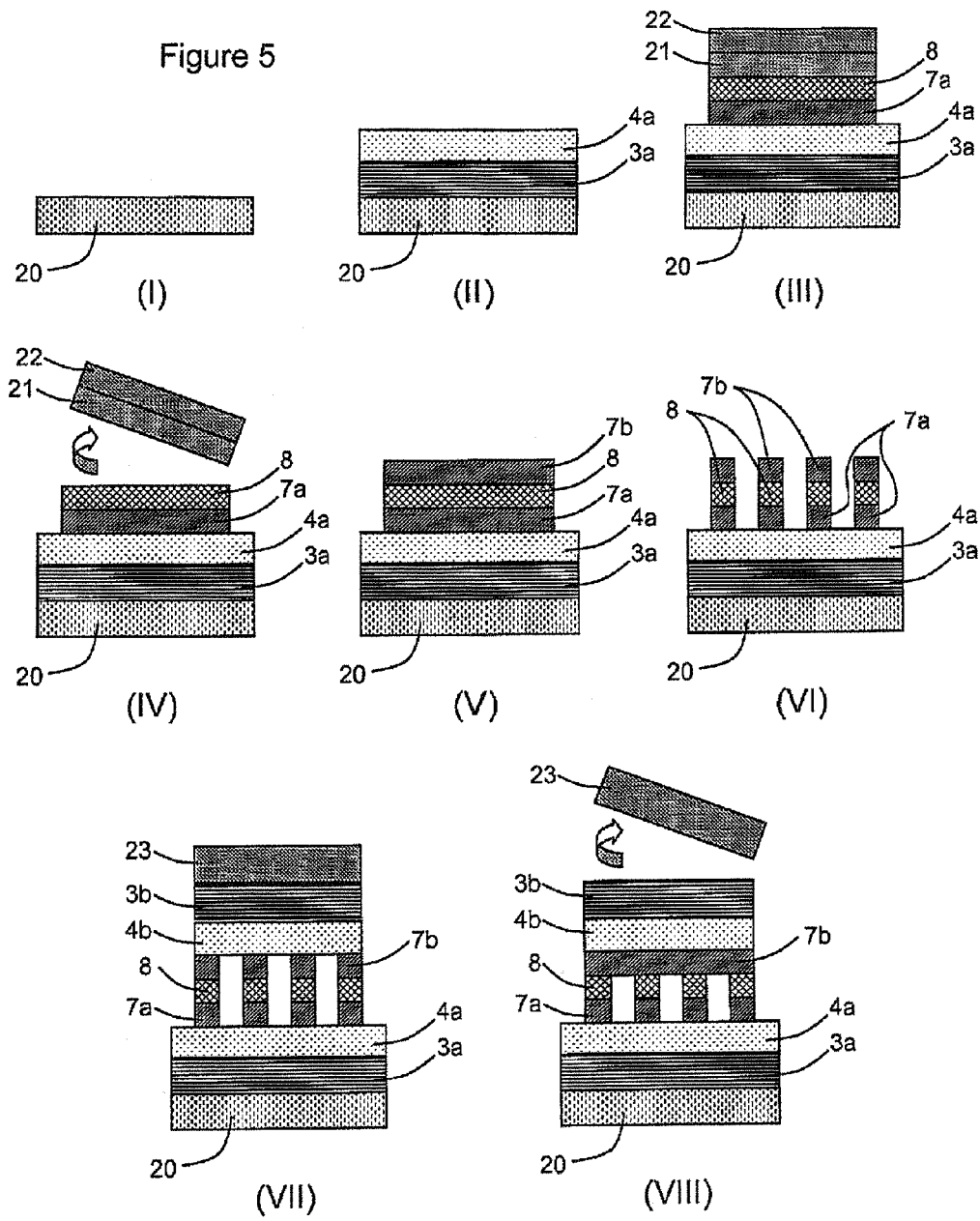

Now, is described an embodiment of the method for manufacturing of a device according to the invention, with reference to FIG. 5.

On a silicon substrate 20 (step I) is carried out the deposit of the first Bragg mirror 3a, constituted of a succession of silicon and silicon dioxide layers, and then of the first portion 4a of the medium 4, in silicon dioxide, of the cavity (step II).

Then, the addition of the first portion of a heterostructure constituting the membrane 6 is carried out. Amongst the assembly of layers forming this membrane, the layer is constituted of a material having nonlinear optical properties (wells or plane of semiconductor quantum dots). In order to operate this addition, the membrane 6 is achieved beforehand on a substrate 22 after having deposited a barrier layer 21. The assembly is then transferred by a sticking technique onto the medium 4a (step III). This substrate 22 is constituted for example of indium phosphide (InP) and the barrier layer 21 in indium-gallium arsenide (InGaAs). After transfer, the substrate 22 and the barrier layer 21 are removed (step IV) selectively to leave only the membrane 6 against the medium 4a.

The membrane is then structured in the form of a photonic crystal (step VI). The structuring is operated such that the photonic crystal membrane 6 has an optical resonant mode at the central working wavelength $\lambda 0$.

Finally, the second portion 4b of the medium 4 and the second Bragg mirror 3b are added on the membrane 6. This is realized analogously to the step II, namely the deposit of an assembly formed by the second portion 4b of the medium 4, the second Bragg mirror 3b. This addition is operated such that the mirrors 3a and 3b are separated by a distance proportional to half the central working wavelength $\lambda 0$. Thus it leads to a device for controlling optical frequencies F1 and F2 according to the invention, around a central optical working frequency F0.

In this method, it may be provided that the assembly of the membrane 6 be etched at the same time, i.e., holes are made at the same time in the layers 7a, 7b and 8.

According to alternatives of this manufacturing method, the electro-mechanical tuning may be obtained by means of selective etchings of all or part of the layer 4 and makes it possible to make either the reflector 3 or the membrane 6 "mobile". Furthermore, it may be provided a subsequent step of constituting means for moving one amongst the heterostructure forming the membrane 6 and at least one Bragg mirror. The moving means 16 and 17 (FIGS. 3 and 4) are thus adequately joined to the device from the manufacturing method object of the invention.

A device for controlling optical frequency according to the invention may be used in numerous applications, particularly for wavelength conversion in the telecommunications field. Other applications are to be considered, as the chemical spectroscopy in the terahertz field, which corresponds to phonon energies or molecule rotation.

Another application is the "pump-probe" spectroscopy, during which two consecutive laser signals of close frequencies are sent on a sample. The first laser constitutes the pump (and modifying the medium properties) and the second laser the probe (probing the medium properties). In the present case, the two laser signals are coming from the same device that is the object of the invention.

The aforementioned embodiments of the present invention are given by way of examples and are in no way limitative. It is obvious that the skilled person is able to achieve different alternatives of the invention within the framework of the invention.

The invention claimed is:

1. A device for controlling optical frequency around a central working frequency comprising a vertical cavity formed of two parallel and partially reflecting walls and a membrane comprising at least one layer structured in the form of a photonic crystal, said two walls being separated by an optical distance proportional to half the wavelength corresponding to the central working frequency, said membrane being integrated between the walls of the cavity and configured to exhibit an optical resonant mode at said central working wavelength and at least one layer of the device comprising at least one portion of a material having nonlinear optical properties, wherein the two walls and the membrane are configured such that the device has two optical resonant modes by strong coupling of the optical modes corresponding to the cavity and the optical modes corresponding to the photonic crystal.

2. A device according to claim 1, wherein the material exhibiting nonlinear optical properties is arranged at a maximum of the vertical distribution of the electromagnetic intensity of at least one of the resonant modes generated by the device.

3. A device according to claim 2, wherein the walls of the cavity are planar and have high reflection coefficients.

4. A device according to claim 3, wherein the walls of the cavity comprise Bragg mirrors.

5. A device according to claim 1, wherein the walls of the cavity are planar and have high reflection coefficients.

6. A device according to claim 5, wherein the walls of the cavity comprise Bragg mirrors.

7. A device according to claim 1, wherein the cavity has dimensions on the order of the working wavelength.

8. A device according to claim 1, wherein the cavity has a higher quality factor than that of the photonic crystal of the membrane.

9. A device according to claim 1, wherein the structure of at least one layer of the photonic crystal of the membrane has the form of a meshed structure in one dimension.

10. A device according to claim 1, wherein the structure of at least one layer of the photonic crystal of the membrane has the form of a meshed structure in two dimensions.

11. A device according to claim 1, wherein the material having nonlinear optical properties is selected from the group consisting of a quantum well and a distribution of semiconductor quantum dots.

12. A device according to claim 1, comprising means for vertically moving the membrane.

13. A device according to claim 12, wherein the moving means is electromechanical.

14. A device according to claim 1, comprising means for vertically moving a wall of the cavity with respect to the other wall.

15. A device according to claim 14, wherein the moving means is electromechanical nature.

16. A system for converting optical frequency, comprising a device for controlling optical frequency according to claim 1, as well as means for optically pumping one of the two generated eigen modes.

17. A system according to claim 16, wherein the medium comprised between the two walls of the cavity is an active medium in a saturable absorbent regime.

18. A system according to claim 17, wherein the medium and the optical pumping means are determined such that one eigen mode does not saturate the absorbent whereas the superposition of two eigen modes saturates it.

19. A system according to claim 16, wherein the medium comprised between the two walls of the cavity is a medium having an optical gain.

20. A system for adding and subtracting optical frequencies comprising a device for controlling optical frequency according to claim 1, as well as means for optically pumping the two generated eigen modes, the material having nonlinear properties of at least one layer of the device having nonlinear properties on the order of 2.

21. A method for manufacturing a device for controlling optical frequency around a central working frequency, successively comprising:
    adding a partially reflecting layer and a medium on a substrate,
    adding a first portion of a heterostructure constituting a membrane formed by an assembly of layers, wherein at least a portion of at least one layer comprises a material having nonlinear optical properties,
    sructuring at least one layer of said first portion in the form of a photonic crystal,
    adding a second portion of said heterostructure such that it exhibits an optical resonant mode at a wavelength corresponding to the central working frequency, and
    adding a medium and a partially reflecting layer on said second portion such that the partially reflecting layers are separated by a distance proportional to half of said wavelength corresponding to the central working frequency.

22. A method according to claim 21, wherein the addition of a portion of the heterostructure consists of a first step of depositing an assembly formed by said portion of the heterostructure and a substrate, and a second step of removing the substrate from the assembly.

23. A method according to claim 21, comprising a subsequent step of providing means for moving one of the heterostructure and at least one of the partially reflecting layers.

* * * * *